United States Patent [19]
Arai

[11] Patent Number: 5,969,474
[45] Date of Patent: Oct. 19, 1999

[54] ORGANIC LIGHT-EMITTING DEVICE WITH LIGHT TRANSMISSIVE ANODE AND LIGHT TRANSMISSIVE CATHODE INCLUDING ZINC-DOPED INDIUM OXIDE

[75] Inventor: Michio Arai, Tokyo, Japan

[73] Assignee: TDK Corporation, Tokyo, Japan

[21] Appl. No.: 08/957,066

[22] Filed: Oct. 24, 1997

[30] Foreign Application Priority Data

Oct. 24, 1996 [JP] Japan .................................. 8-299745

[51] Int. Cl.⁶ .................................................. H01J 1/62
[52] U.S. Cl. ........................... 313/504; 313/503; 313/506
[58] Field of Search .................................. 313/504, 503, 313/506

[56] References Cited

U.S. PATENT DOCUMENTS 4,099,091 7/1978 Yamazoe et al. ........................ 313/509
5,729,087 3/1998 Chien ...................................... 313/495
5,747,930 5/1998 Utsugi .................................... 313/504

*Primary Examiner*—Sandra O'Shea
*Assistant Examiner*—Ronald E. DelGizzi
*Attorney, Agent, or Firm*—Oblon, Spivak, McClelland, Maier & Neustadt, P.C.

[57] ABSTRACT

An organic EL light emitting device has a light emitting layer between a cathode and an anode. Both the cathode and the anode are light transmissive. The cathode includes a conductor layer of a metal or alloy with a work function of up to 4 eV having a thickness of up to 10 nm on the light emitting layer side, a transparent electrode of zinc-doped indium oxide on a side remote from the light emitting layer, and optionally a buffer layer between the conductor layer and the transparent electrode. Light emission can exit from the device on both the cathode and anode sides.

9 Claims, 1 Drawing Sheet

PRIOR ART

ORGANIC LIGHT-EMITTING DEVICE WITH LIGHT TRANSMISSIVE ANODE AND LIGHT TRANSMISSIVE CATHODE INCLUDING ZINC-DOPED INDIUM OXIDE

This invention relates to an organic electroluminescent light emitting device (to be referred to as organic EL device, hereinafter) using organic compounds, and more particularly, to an improvement in the cathode for supplying electrons to a light emitting layer.

BACKGROUND OF THE INVENTION

Recently, active research works have been made on organic EL light emitting devices. Referring to FIG. 2, there is illustrated one typical organic EL light emitting device. As a basic configuration, the device includes a glass substrate 21 and a transparent electrode or anode 22 of tin-doped indium oxide (ITO) or the like formed on the substrate 21. A thin film 23 serving as a hole transporting layer is formed on the anode 22 by evaporating a hole transporting material such as tetraphenyldiamine (TPD). A light emitting layer 24 of a fluorescent material such as an aluminum quinolinol complex (Alq3) is deposited on the layer 23. An electrode or cathode 25' is formed thereon from a metal having a low work function such as magnesium. Such organic EL devices are attractive in that they can achieve a very high luminance ranging from 100 to 1,000 $cd/m^2$ with a drive voltage of approximately 10 volts.

The cathode of such organic EL devices is generally formed of a material capable of injecting more electrons into the light emitting layer. Differently stated, a material having a lower work function is believed suitable as the cathode. There are known many materials having a low work function. The materials which are known effective as the cathode of EL light emitting devices include alloys such as MgAg and MgIn as described in JP-A 15595/1990 and combinations of an alkali metal and a metal having a high work function, for example, intermetallic compounds such as AlCa and AlLi.

Where the organic EL device is constructed to the structure shown in FIG. 2 wherein the cathode 25' is not light transmissive, light emission is taken out from the anode 22 side. This limits the manner of application of the organic EL device when it is used as a light emitting device or display device.

When the organic EL device is used as a display device such as a matrix display, a part of light emission is reflected by the cathode thin film 25' and the reflected light also comes out from the anode 22 side. In the event of the cathode 25' having a particular reflectivity, the reflected light is diverted to reduce the contrast of the display screen. On outdoor use or use in a brightly illuminated place, sunlight or external intense light enters the device to produce intense reflected light which causes to further reduce the contrast.

One known attempt to take out light emission of an organic EL device from both the cathode and anode sides is the use of Mg-Ag and ITO in the cathode as described in SID 96 DIGEST.185 14.2: Novel Transparent Organic Electroluminescent Devices, G. Gu, V. B. Bulovic, P. E. Burrows, S. R. Forrest, M. E. Tompson. In this device, the cathode is constructed by forming Mg-Ag on the light emitting layer of Alq3 to a thickness of 100 Å and then depositing ITO thereon. The device produces light emission at a luminance of 500 $cd/m^2$ with a drive voltage of 10 volts while both the cathode and anode provide substantially equal light transmission in the wavelength range of 480 to 570 nm.

The cathode consisting of Mg-Ag and ITO layers, however, has low efficiency since the ITO layer as deposited does not have a low resistance. In order that ITO have a low resistance at room temperature, it must be heat treated. The heat treatment can damage the organic EL device to impair its performance.

SUMMARY OF THE INVENTION

An object of the present invention is to provide an organic EL light emitting device having a cathode which is light transmissive without a need for heat treatment so that light emission can be taken out from both the cathode and anode sides.

The present invention provides an organic EL light emitting device comprising a light emitting layer between a cathode and an anode. Both the cathode and the anode are light transmissive. The cathode includes a conductor layer of a metal or alloy with a work function of up to 4 eV having a thickness of up to 10 nm on the light emitting layer side and a transparent electrode of zinc-doped indium oxide on a side remote from the light emitting layer. The cathode may further include a buffer layer between the conductor layer and the transparent electrode.

DESCRIPTION OF THE PREFERRED EMBODIMENTS

Figure 1:
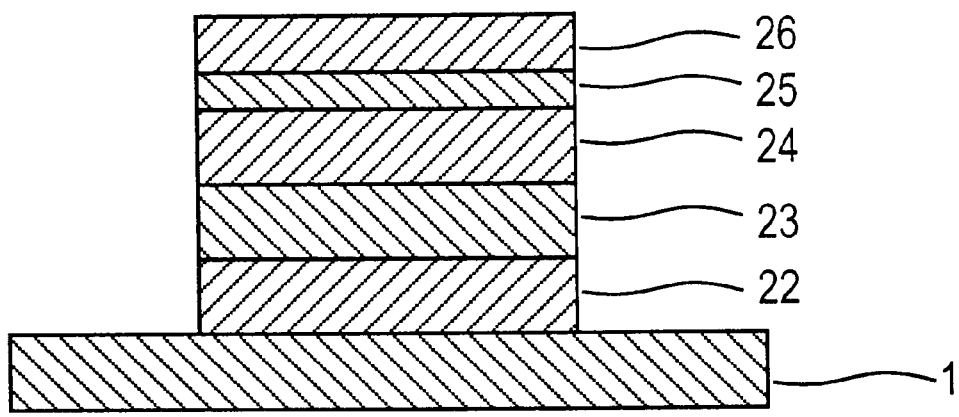
FIG. 1 is a schematic view showing the basic construction of an organic EL light emitting device according to one embodiment of the invention.
Figure 2:
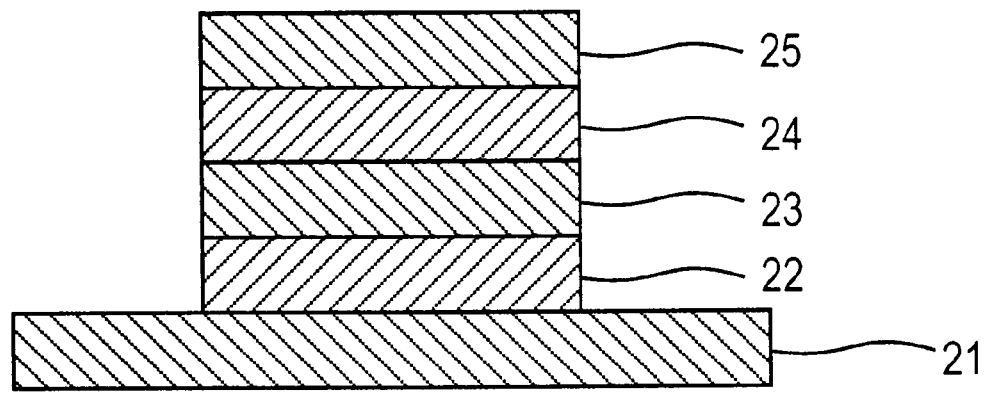
FIG. 2 is a schematic view showing the basic construction of a prior art organic EL device.

In the organic EL light emitting device of the invention, both the cathode and the anode are light transmissive. The cathode includes a conductor layer of a metal or alloy with a work function of up to 4 eV having a thickness of up to 10 nm on the light emitting layer side and a transparent electrode of zinc-doped indium oxide ($In_2O_3$+ZnO, to be often referred to as IZO, hereinafter) on the side of the conductor layer remote from the light emitting layer. By the term "light transmissive" layer it is meant that more than 40% of the light that the layer receives in a wavelength range of at least 100 nm wide including the wavelength band of light emission is transmitted by the layer.

The conductor layer is formed of a metal or alloy with a work function of up to 4 eV because the efficiency of electron injection and hence, the efficiency of light emission is improved. Examples of the metal having a work function of up to 4 eV include K, Li, Na, Mg, La, Ce, Ca, Sr, Ba, Al, Ag, In, Sn, Zn, and Zr. Examples of the alloy having a work function of up to 4 eV include Ag-Mg (Ag 1 to 20 at %), Al-Li (Li 0.5 to 20 at %), In-Mg (Mg 50 to 80 at %), and Al-Ca (Ca 5 to 20 at %), with the Ag-Mg and Al-Li being preferred. The term "at %" as used herein means atomic percent.

The conductor layer having a work function of up to 4 eV should have a thickness of 10 nm or less, preferably 3 to 10 nm, more preferably 3 to 8 nm. A layer thicker than 10 nm obstructs light transmission whereas a too thin layer would have poor physical properties. The conductor layer preferably has a sheet resistance of about 1 to 50 $\Omega/\square$.

The conductor layer may be formed by evaporation although sputtering, especially DC sputtering is preferred. In the case of DC sputtering, a power in the range of 0.1 to 4

W/cm², especially 0.5 to 1 W/cm² is preferably supplied. No particular limit is imposed on the sputtering gas and inert gases such as Ar, He, Ne, Kr, and Xe and mixtures thereof may be used. The gas is usually kept under a pressure of about 0.1 to 20 Pa during sputtering.

Tin-doped indium oxide (ITO) and zinc-doped indium oxide (IZO) are known as the transparent electrode. The present invention selects IZO because a layer thereof as deposited has a low resistance without a need for aging. Usually IZO contains $In_2O_3$ and ZnO in a stoichiometric composition while the amount of oxygen may deviate from the stoichiometry. When IZO is represented by $InO_y \cdot ZnO_z$, it is preferred that y is 1.0 to 2.0 and z is 0.8 to 1.2. Differently stated, ZnO is preferably 1 to 20 mol %, more preferably 5 to 12 mol % of a mixture of $In_2O_3$ and ZnO. It is acceptable that IZO contains other elements such as Sn, Ti, and Pb in oxide form and in an amount of less than 1 mol % calculated as oxide.

A thin film of IZO may be formed by co-evaporation although a sputtering technique using a target of ZnO-doped $In_2O_3$ is preferred. A cathode formed by sputtering experiences a less change with time of luminance than that formed by evaporation. RF sputtering equipment is often used. Its frequency is not critical insofar as it falls in the RF band although a frequency of 13.56 MHz is most often used. A power of 0.1 to 4 W/cm², especially 0.5 to 1 W/cm² is preferably supplied. No particular limit is imposed on the sputtering gas and inert gases such as Ar, He, Ne, Kr, and Xe and mixtures thereof may be used. The gas is usually kept under a pressure of about 0.1 to 20 Pa during sputtering.

The IZO layer has a sufficient thickness to perform electron injection, preferably in the range of 50 to 500 nm, more preferably 50 to 300 nm. A too thick IZO layer has the risk of delamination whereas a too thin layer is undesirable with respect to the film strength during manufacture and electron transporting ability.

The cathode consisting essentially of the conductor layer having a work function of up to 4 eV and a thickness of up to 10 nm and the transparent electrode layer of ($In_2O_3$+ZnO) may have an overall thickness of at least 50 nm, preferably at least 200 nm. The upper limit is not critical although 500 nm is the upper limit in many cases.

A buffer layer is preferably interleaved between the conductor layer and the transparent electrode in order to prevent the conductor layer from being oxidized by interfacial reaction therebetween. The buffer layer is preferably formed of a metal such as titanium, chromium and tantalum or a nitride thereof to a thickness of 5 to 20 nm, especially 5 to 10 nm.

Referring to FIG. 1, there is illustrated the basic construction of an organic EL light emitting device according to one embodiment of the invention. The EL device has an anode 22, a hole injecting and transporting layer 23, a light emitting and electron injecting and transporting layer 24, and a cathode consisting of a conductor layer 25 and a transparent electrode layer 26 formed on a substrate 1 in the described order. The EL device of the invention is not limited to the illustrated construction and may have various other constructions. For example, an electron injecting and transporting layer may be interleaved between the light emitting layer and the cathode.

The cathode is constructed as described above. Organic layers such as the light emitting layer can be formed by vacuum evaporation, and the anode be formed by evaporation or sputtering. If necessary, these layers can be patterned, for example, by mask evaporation or film formation followed by etching whereby a desired light emitting pattern is accomplished. If the substrate bears thin film transistors (TFT), the respective layers may be formed in accordance with the pattern of TFT to accomplish a display or drive pattern without further treatment.

Finally, a protective layer is formed over the device using inorganic materials such as SiOx and organic materials such as Teflon®. The protective layer is made transparent, preferably such that the transmittance of light emission is 80% or more, by selecting a transparent material such as $SiO_2$ and SiAlON or controlling the thickness. In general, the protective layer is about 50 to 1,200 nm thick. The protective layer is formed by conventional sputtering, evaporation and other techniques.

It is preferred to form a sealing layer on the device in order to prevent the organic and electrode layers from oxidation. The sealing layer for preventing the entry of moisture may be formed by bonding sealing plates such as glass plates with moisture-proof adhesive resin layers such as commercially available sheets of photo-curable adhesives, epoxy adhesives, silicone adhesives, and crosslinking ethylene-vinyl acetate copolymer adhesives. Instead of the glass plates, plates of transparent materials such as plastic plates may also be used.

Next, the organic material layers included in the EL device of the invention is described.

The light emitting layer has functions of injecting holes and electrons, transporting them, and recombining holes and electrons to create excitons. It is preferred that relatively electronically neutral compounds be used in the light emitting layer.

The charge transporting layer, which is also referred to as a hole injecting and transporting layer, has functions of facilitating injection of holes from the anode, transporting holes, and obstructing electron transportation. If necessary, for example, when the compound used in the light emitting layer has a relatively low electron injecting and transporting function, an electron injecting and transporting layer having functions of facilitating injection of electrons from the cathode, transporting electrons, and obstructing hole transportation may be provided between the light emitting layer and the cathode as previously described. The hole and electron injecting and transporting layers are effective for increasing the number of holes and electrons injected into the light emitting layer and confining holes and electrons therein for optimizing the recombination region to improve light emission efficiency. Each of the hole and electron injecting and transporting layers may be constructed by separately providing a layer having an injecting function and a layer having a transporting function.

The thickness of the light emitting layer, the hole injecting and transporting layer, and the electron injecting and transporting layer is not critical and varies with a particular formation technique although it is usually preferred to be about 5 to 100 nm, especially about 10 to 100 nm.

The thickness of the hole injecting and transporting layer and the electron injecting and transporting layer is equal to or ranges from about 1/10 times to about 10 times the thickness of the light emitting layer although it depends on the design of a recombination/light emitting region. When the electron or hole injecting and transporting layer is divided into an injecting layer and a transporting layer, preferably the injecting layer is at least 1 nm thick and the transporting layer is at least 20 nm thick. The upper limit of thickness is usually about 100 nm for the injecting layer and about 100 nm for the transporting layer. The same film thickness applies when two injecting and transporting layers are provided.

By controlling the layer thickness while taking into account the carrier mobility and carrier density (depending on ionization potential and electron affinity) of the light emitting layer, the hole injecting and transporting layer, and the electron injecting and transporting layer to be combined, the free design of a recombination/light emitting region, the design of emission color, the control of the luminance and spectrum of light emission by the interference of both the electrodes, and the control of the spatial distribution of light emission become possible.

In the organic EL device according to the invention, the light emitting layer contains a fluorescent material that is a compound having a light emitting capability. The fluorescent material may be selected from metal complex dyes such as tris(8-quinolinolato)aluminum as disclosed in JP-A 264692/1988, for example. Additionally, quinacridone, coumarin, rubrene, and styryl dyes, tetraphenylbutadiene, anthracene, perylene, coronene, and 12-phthaloperinone derivatives may be used alone or in admixture with the metal complex dye. In the embodiment wherein the light emitting layer also serves as an electron injecting and transporting layer, the use of tris(8-quinolinolato)aluminum is preferred. These fluorescent materials can be evaporated or otherwise deposited.

For the electron injecting and transporting layer which is provided if necessary, there may be used organic metal complexes such as tris(8-quinolinolato)aluminum (Alq3), oxadiazole derivatives, perylene derivatives, pyridine derivatives, pyrimidine derivatives, quinoline derivatives, quinoxaline derivatives, diphenylquinone derivatives, and nitro-substituted fluorene derivatives. The electron injecting and transporting layer can also serve as a light emitting layer as previously mentioned. In this case, use of tris(8-quinolinolato)aluminum etc. is preferred. Like the light emitting layer, the electron injecting and transporting layer may be formed by evaporation or the like.

Where the electron injecting and transporting layer is formed as comprising an electron injecting layer and an electron transporting layer, two or more compounds are selected in a proper combination from the compounds commonly used in electron injecting and transporting layers. In this regard, it is preferred to laminate layers in such an order that a layer of a compound having a greater electron affinity may be disposed adjacent the cathode. This order of lamination also applies where a plurality of electron injecting and transporting layers are provided.

For the hole injecting and transporting layer, there may be used various organic compounds as described in JP-A 295695/1988, 191694/1990, 000792/1991, 234681/1993, 239455/1993, 299174/1993, 126225/1995, 126226/1995, and 100172/1996 and EP 0650955A1. Examples are tetraaryl-benzidine compounds (triaryldiamine or tetraphenyldiamine (TPD)), aromatic tertiary amines, hydrazone derivatives, carbazole derivatives, triazole derivatives, imidazole derivatives, oxadiazole derivatives having an amino group, and polythiophenes. These compounds may be used in a combination of two or more and for the combined used, they may be stacked as separate layers or mixed.

Where the hole injecting and transporting layer is formed as comprising a hole injecting layer and a hole transporting layer, two or more compounds are selected in a proper combination from the compounds commonly used in hole injecting and transporting layers. In this regard, it is preferred to laminate layers in such an order that a layer of a compound having a lower ionization potential may be disposed adjacent the anode (ITO etc.). It is also preferred to use a compound having good thin film forming ability at the anode surface. The order of lamination also applies where a plurality of hole injecting and transporting layers are provided. Such an order of lamination is effective for lowering drive voltage and preventing the occurrence of current leakage and the appearance and growth of dark spots. Since evaporation is utilized in the manufacture of devices, films as thin as about 1 to 10 nm can be formed uniform and pinhole-free, which restrains any change in color tone of light emission and a drop of efficiency by re-absorption even if a compound having a low ionization potential and absorption in the visible range is used in the hole injecting layer. Like the light emitting layer and the like, the hole injecting and transporting layer can be formed by evaporating the above-mentioned compounds.

For the transparent electrode used as the anode in the practice of the invention, the type and thickness of an anode-forming material are properly determined such that the transmittance of light emission is 80% or higher. For example, tin-doped indium oxide (ITO), zinc-doped indium oxide (IZO), $SnO_2$, and polypyrrole doped with a dopant may be used as the anode. The anode preferably has a thickness of about 10 to 500 nm. The drive voltage should preferably be low in order to improve the reliability of the device.

As to the substrate material, transparent or translucent materials such as glass, quartz and resins are used. The substrate may be provided with a color filter film, fluorescent material-containing color conversion film or dielectric reflecting film for controlling the color of light emission.

Since both the electrodes are light transmissive, the device of the invention finds a wider range of application including transparent displays (typically window displays) and displays utilizing a background pattern. A display which is distinctly viewable in widely varying environments can be accomplished by providing a material having high light absorbing effect on the surface of one electrode to enhance the contrast. Such a material can be provided on either electrode side by forming the material into a film and joining the film to the substrate or protective layer.

The organic EL device of the invention is generally of the DC drive type while it can be of the AC or pulse drive type. The applied voltage is generally about 5 to 20 volts.

EXAMPLE

Examples of the present invention are given below by way of illustration and not by way of limitation.

Example 1

ITO was sputtered on a glass substrate to a thickness of 200 nm to form a transparent electrode, which was patterned and subjected to ultrasonic washing with neutral detergent, acetone, and ethanol. The substrate was pulled up from boiling ethanol and dried. The transparent electrode on its surface was cleaned with $UV/O_3$. The substrate was secured by a holder in a vacuum evaporation chamber, which was evacuated to a vacuum of lower than $1\times10^{-4}$ Pa.

With the vacuum kept, N,N'-diphenyl-N,N'-m-tolyl-4,4'-diamino-1,1'-biphenyl (TPD) was evaporated on the ITO electrode at a deposition rate of 0.2 nm/sec. to a thickness of 55 nm to form a hole injecting and transporting layer.

With the vacuum kept, tris(8-quinolinolato)aluminum (Alq3) was evaporated at a deposition rate of 0.2 nm/sec. to a thickness of 50 nm to form an electron injecting/transporting and light emitting layer.

Next, the substrate having the layers deposited thereon was transferred from the vacuum evaporation chamber to a sputtering equipment where a conductor layer was deposited at a deposition rate of 10 nm/min. to a thickness of 30 nm by DC sputtering using an Ag-Mg alloy (Ag 5 at %) as the target. Subsequently, a thin film serving as a transparent electrode was deposited at a deposition rate of 50 Å/min. to a thickness of 170 nm to complete a cathode by RF sputtering using $In_2O_3$ doped with 5% of ZnO as the target. The sputtering gas used was argon and its pressure was 1 Pa at room temperature. The input power was 1 W/cm² at a frequency of 13.56 MHz. The distance between the substrate and the target was 8 cm. The transparent electrode had a sheet resistance of 17 Ω/□ and the overall cathode had a sheet resistance of 30 Ω/□. The conductor layer in the form of the Ag-Mg thin film had the same composition as the target and its work function was 3.8 eV.

Finally, $SiO_2$ was sputtered to a thickness of 100 nm to form a protective layer. An organic thin film light emitting device or EL device was completed in this way.

A DC voltage was applied across the organic thin film light emitting device to continuously drive the device at a constant current density of 10 mA/cm². At the initial, the device when driven at 8.5 volts was found to emit green light at a luminance of 250 cd/m² (light emission maximum wavelength λmax=520 nm) as observed from the cathode side. The cathode had a light transmittance of 60% in the light emission wavelength band. The half-life of luminance was 500 hours, with a drive voltage increase of 2 volts. Neither appearance nor growth of dark spots was observed. The device continued stable light emission without current leakage during the subsequent operation.

Example 2

An organic EL device was fabricated as in Example 1 except that the cathode was formed as follows. The conductor layer of the cathode was similarly formed using an Al-Li alloy (Li 3 at %) as the target. The conductor layer in the form of the Al-Li thin film had the same composition as the target and its work function was 3.9 eV. A buffer layer of 5 nm thick was then deposited using TiN as the target. Then a transparent electrode was formed as in Example 1. The overall cathode had a sheet resistance of 15 Ω/□.

A DC voltage was applied across the organic thin film light emitting device to continuously drive the device at a constant current density of 10 mA/cm². At the initial, the device when driven at 8.5 volts was found to emit green light at a luminance of 260 cd/m² (light emission maximum wavelength λmax=520 nm) as observed from the cathode side. The cathode had a light transmittance of 51% in the light emission wavelength band. The half-life of luminance was 500 hours, with a drive voltage increase of 1.7 volts. Neither appearance nor growth of dark spots was observed. The device continued stable light emission without current leakage during the subsequent operation.

There has been described an organic EL light emitting device having a cathode which is light transmissive and efficient in electron injection without a need for heat treatment so that light emission can exit from the device on both the cathode and anode sides.

Although some preferred embodiments have been described, many modifications and variations may be made thereto in the light of the above teachings. It is therefore to be understood that within the scope of the appended claims, the invention may be practiced otherwise than as specifically described.

I claim:

1. An organic electroluminescent light emitting device comprising a cathode, an anode, and a light emitting layer therebetween;

both the cathode and the anode being light transmissive;

the cathode comprising a conductor layer and a transparent electrode;

the conductor layer having a thickness of up to 10 nm, being in contact with the transparent electrode, being closer to the light emitting layer than the transparent electrode, and comprising a metal or alloy, the metal or alloy having a work function of up to 4 eV; and the transparent electrode comprising zinc-doped indium oxide, wherein the zinc-doped indium oxide is represented by $InO_y \cdot ZnO_z$, where y is 1.0 to 2.0 and z is 0.8 to 1.2.

2. The organic electroluminescent light emitting device of claim 1 wherein the cathode further includes a buffer layer between the conductor layer and the transparent electrode.

3. The organic electroluminescent light emitting device of claim 1, further comprising a substrate, wherein the anode is adjacent to the substrate.

4. The organic electroluminescent light emitting device of claim 1, wherein the metal or alloy of the conductor layer is selected from a group consisting of K, Li, Na, Mg, La, Ce, Ca, Sr, Ba, Al, Ag, In, Sn, Zn, Zr, Ag-Mg (Ag 1 to 20 at %), Al-Li (Li 0.5 to 20 at %), In-Mg (Mg 50 to 80 at %), and Al-Ca (Ca 5 to 20 at %).

5. The organic electroluminescent light emitting device of claim 1, wherein the transparent electrode of zinc-doped indium oxide has a thickness of from 50 to 500 nm.

6. The organic electroluminescent light emitting device of claim 2, wherein the buffer layer comprises at least one of titanium, chromium and tantalum, or a nitride thereof.

7. The organic electroluminescent light emitting device of claim 2, wherein the buffer layer has a thickness of from 5 to 20 nm.

8. A method of fabricating a light emitting device, the method comprising forming the organic electroluminescent light emitting device of claim 1.

9. A method of emitting light from a device, the method comprising using the organic electroluminescent light emitting device of claim 1 to emit light.

* * * * *